United States Patent
Butron-Ccoa et al.

(10) Patent No.: US 10,168,381 B2
(45) Date of Patent: Jan. 1, 2019

(54) METHOD FOR DETERMINING A DETERIORATION OF POWER SEMICONDUCTOR MODULES AS WELL AS A DEVICE AND CIRCUIT ARRANGEMENT

(71) Applicant: Siemens Aktiengesellschaft, Munich (DE)

(72) Inventors: Jimmy-Alexander Butron-Ccoa, Zorneding (DE); Andreas Lindemann, Magdeburg (DE); Gerhard Mitic, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/548,201

(22) PCT Filed: Dec. 18, 2015

(86) PCT No.: PCT/EP2015/080543
§ 371 (c)(1),
(2) Date: Aug. 2, 2017

(87) PCT Pub. No.: WO2016/124296
PCT Pub. Date: Aug. 11, 2016

(65) Prior Publication Data
US 2018/0017612 A1    Jan. 18, 2018

(30) Foreign Application Priority Data
Feb. 3, 2015  (EP) .................................. 15153561

(51) Int. Cl.
*G01R 31/02* (2006.01)
*G01R 31/26* (2014.01)
(Continued)

(52) U.S. Cl.
CPC .......... *G01R 31/2619* (2013.01); *G01K 7/01* (2013.01); *G01R 31/261* (2013.01);
(Continued)

(58) Field of Classification Search
CPC .............. G01R 31/2608; G01R 31/261; G01R 31/2612; G01R 31/2614; G01R 31/2616; G01R 31/2617; G01R 31/2619
(Continued)

(56) References Cited

U.S. PATENT DOCUMENTS

| | | | |
|---|---|---|---|
| 2009/0167414 A1* | 7/2009 | Jansen | G01K 1/14 327/513 |
| 2012/0077537 A1* | 3/2012 | Muratov | H04B 5/0037 455/522 |
| 2013/0017701 A1* | 1/2013 | Lee | H01R 13/6272 439/344 |

FOREIGN PATENT DOCUMENTS

| | | | | |
|---|---|---|---|---|
| DE | 10351843 A1 | 6/2005 | ............... | G01K 7/01 |
| DE | 102012222481 A1 | 6/2014 | ............ | G01R 31/26 |

(Continued)

OTHER PUBLICATIONS

Lutz, Josef, "Halbleiter-Leistungsbauelemente: Physik, Eigenschaften, Zuverlässigkeit," Springer-Verlag, pp. 126-127 (6 pages) (German language w/ English translation), 2006.
(Continued)

*Primary Examiner* — Jermele M Hollington
*Assistant Examiner* — Raul Rios Russo
(74) *Attorney, Agent, or Firm* — Slayden Grubert Beard PLLC

(57) ABSTRACT

The present disclosure relates to power semiconductor modules. The teachings thereof may be embodied in modules with a power semiconductor component and methods, as well as a circuit arrangement. For example, a method may (Continued)

include: developing a thermal model of the power semiconductor module at a reference time point; establishing a reference temperature based on the thermal model; measuring a temperature-sensitive electrical parameter of the power semiconductor module during operation of the power semiconductor module; determining a current temperature from the measured temperature-sensitive electrical parameter of the power semiconductor module; calculating a temperature difference between the current temperature and the reference temperature; and determining a deterioration of the power semiconductor module based on the calculated temperature difference.

15 Claims, 3 Drawing Sheets

(51) Int. Cl.
*G01K 7/01* (2006.01)
*G01R 31/04* (2006.01)
*H02M 1/32* (2007.01)
*H03K 17/08* (2006.01)
*G01K 3/10* (2006.01)

(52) U.S. Cl.
CPC ..... *G01R 31/2608* (2013.01); *G01R 31/2612* (2013.01); *G01R 31/2614* (2013.01); *G01R 31/2628* (2013.01); *G01R 31/2642* (2013.01); *G01K 3/10* (2013.01); *G01R 31/046* (2013.01); *H02M 2001/327* (2013.01); *H03K 2017/0806* (2013.01)

(58) Field of Classification Search
USPC ......... 324/71, 378, 403, 415, 425, 500, 537, 324/762.01, 762.08
See application file for complete search history.

(56) References Cited

FOREIGN PATENT DOCUMENTS

| | | | |
|---|---|---|---|
| EP | 2615467 A1 | 7/2013 | ............... G01K 7/01 |
| WO | 2016/124296 A1 | 8/1916 | ............... G01K 7/01 |

OTHER PUBLICATIONS

European Search Report and Written Opinion, Application No. 15153561.4, 7 pages, dated Jul. 28, 2015.

* cited by examiner

METHOD FOR DETERMINING A DETERIORATION OF POWER SEMICONDUCTOR MODULES AS WELL AS A DEVICE AND CIRCUIT ARRANGEMENT

CROSS-REFERENCE TO RELATED APPLICATIONS

This application is a U.S. National Stage Application of International Application No. PCT/EP2015/080543 filed Dec. 18, 2015, which designates the United States of America, and claims priority to EP Application No. 15153561.4 filed Feb. 3, 2015, the contents of which are hereby incorporated by reference in their entirety.

TECHNICAL FIELD

The present disclosure relates to power semiconductor modules. The teachings thereof may be embodied in modules with a power semiconductor component and methods, as well as a circuit arrangement.

BACKGROUND

Power semiconductor modules may comprise a power inverter or a converter and generally at least one power semiconductor chip or a power semiconductor component. The latter may control and switch high electrical currents and voltages. Such a power semiconductor component may include a power metal-oxide field effect transistor (power MOSFET), a power diode, or a bipolar transistor with an insulated gate electrode (insulated-gate bipolar transistor, abbreviated to IGBT). To form the power semiconductor module, the power semiconductor components are usually soldered onto a substrate and connected to each other electrically by bond connections.

Power semiconductor modules can be characterized by an expected lifetime. The lifetime corresponds to the time until the power semiconductor module fails or becomes functionally non-viable. During operation of the power semiconductor module a remaining lifetime of the power semiconductor module can change through a deterioration of the power semiconductor module, for example. In particular, the remaining lifetime of the power semiconductor module reduces if the power module deteriorates.

The deterioration of the power semiconductor module may be accelerated during any operation in which the power semiconductor modules is subjected to thermal and mechanical stresses. These stresses can lead to a so-called thermomechanical fatigue of the power semiconductor module, which may result in the failure or a functional non-viability of the power semiconductor module (e.g., the end of the lifetime). Thermal stresses may include temperature change stresses from the electrical operation of the power semiconductor module as a result of different coefficients of thermal expansion of the materials in the power semiconductor module. Such examples may include fatigue at the electrical connection points, for example of bond connections and solder connections of the chip solder and of the system solder. The fatigue at the connection points may cause the bond connections or the solder connections to work loose, which leads to an increased temperature of the semiconductor chip. Thus the thermomechanical fatigue of the power semiconductor module causes the deterioration of the power semiconductor module to accelerate, which can lead to a reduced remaining lifetime and to a premature failure of the power semiconductor module.

To guarantee safe operation of the power semiconductor module, some systems use a prediction of the lifetime of the power semiconductor module. In the prior art, lifetime calculations may be based on lifetime curves and predetermined load profiles, and carried out with computer support. For this purpose, for example a temperature of the power semiconductor modules is monitored. In some systems, thermistors are soldered to the substrate along with the power semiconductor components. The spatial separation of the thermistors from the power semiconductor components inhibits the detectiong of exact transient temperatures of the chips, and reduces the accuracy of the lifetime calculations.

In some systems, equivalent thermal networks are created for the power semiconductor modules, on the basis of which conclusions can be drawn indirectly about the temperature of power semiconductor components. The electrical losses of the IGBTs and of the diodes can be calculated from current and voltage measurements or using the knowledge of the operating point of the power semiconductor module. Thus, although the temperatures of the power semiconductor components during operation can be calculated, no account is generally taken in the equivalent thermal networks of any deterioration of the power semiconductor components.

The teachings of the present disclosure may provide a solution through which a deterioration of power semiconductor modules can be determined more reliably and through this solution a remaining lifetime of the power semiconductor modules can be predicted more accurately. For example, some embodiments may include a method for characterizing a power semiconductor module comprising: determining a thermal model (4) of a power semiconductor module (1) at a reference time point; establishing a reference temperature ($T_{j,zth}$) on the basis of the thermal model (4) of the power semiconductor module (1); measuring at least one temperature-sensitive electrical parameter (TSEP) of the power semiconductor module (1) at at least one later point in time compared to the reference time point, during operation of the power semiconductor module (1); establishing a current temperature ($T_{j,tsep}$) of the power semiconductor module (1) from the at least one measured temperature-sensitive electrical parameter (TSEP) of the power semiconductor module (1); establishing a temperature difference ($\Delta T$) between the current temperature ($T_{j,tsep}$) and the reference temperature ($T_{j,zth}$); and determining a deterioration of the power semiconductor module (1) on the basis of the temperature difference ($\Delta T$) established.

In some embodiments, for creation of the thermal model (4), a thermal impedance of the power semiconductor module (1) describing a thermal path of the power semiconductor module (1) is determined.

In some embodiments, for creation of the thermal model (4), a power dissipation (P) of the power semiconductor module (1) is determined.

In some embodiments, for creation of the thermal model (4), a temperature ($T_c$) of a cooling element (3) of the power semiconductor module (1) is acquired during operation of the power semiconductor module (1).

In some embodiments, a power semiconductor module (1) is characterized, which has a IGBT as the at least one power semiconductor component (2).

In some embodiments, an electrical threshold voltage and/or a Miller plateau and/or a turn-on delay time and/or a turn-off delay time and/or a maximum speed of current increase ($dI/dt|_{max}$) and/or a recovered charge and/or a tail current and/or a voltage peak $U_{EE'max}$ during a turn-on process and/or a turn-on duration and/or a turn-off duration is measured as the at least one temperature-sensitive electrical parameter (TSEP).

In some embodiments, a characteristic curve (6) is determined, on the basis of which each value of the at least one temperature-sensitive electrical parameter (TSEP) is assigned a temperature value, wherein one of the temperature values is determined as a function of the measured temperature-sensitive electrical parameter (TSEP) as the current temperature ($T_{j,tsep}$).

In some embodiments, for determining the characteristic curve (6), the temperature values are predetermined for the power semiconductor module (1), the power semiconductor module (1) is set to the respective temperature value and the respective value of the at least one temperature-sensitive electrical parameter (TSEP) is measured at the predetermined temperature value.

In some embodiments, a heating device is provided for setting the temperature values, by means of which a temperature of the power semiconductor module (1) is increased step-by-step to the respective predetermined temperature values.

In some embodiments, the measurement of the at least one temperature-sensitive electrical parameter (TSEP) for creating the characteristic curve (6) is carried out at the respective predetermined temperature value by means of a double-pulse measurement circuit (10).

As another example, some embodiments may include a device for characterizing a power semiconductor module (1) during operation of the power semiconductor module (1). The device may include a measuring device for measuring at least one temperature-sensitive electrical parameter (TSEP) of the power semiconductor module (1) and a calculation device for establishing a current temperature ($T_{j,tsep}$) from the at least one temperature-sensitive electrical parameter (TSEP) and for calculating a temperature difference ($\Delta T$) between a predetermined reference temperature ($T_{j,zth}$) and the current temperature ($T_{j,tsep}$).

As another example, some embodiments, may include a circuit arrangement, which has a power semiconductor module (1) with at least one power semiconductor component (2) and a device as described above.

In some embodiments, the power semiconductor module (1) comprises an inverter and at least one cooling element (3), wherein the inverter has at least one IGBT as the at least one power semiconductor component (2).

In some embodiments, the circuit arrangement has a control device (7), which is designed to regulate a power of the power semiconductor module (2) as a function of the temperature difference ($\Delta T$) established.

BRIEF DESCRIPTION OF THE DRAWINGS

The methods are explained in greater detail below on the basis of a exemplary embodiment as well as with reference to the enclosed drawings. In the figures.

DETAILED DESCRIPTION

Figure 1:
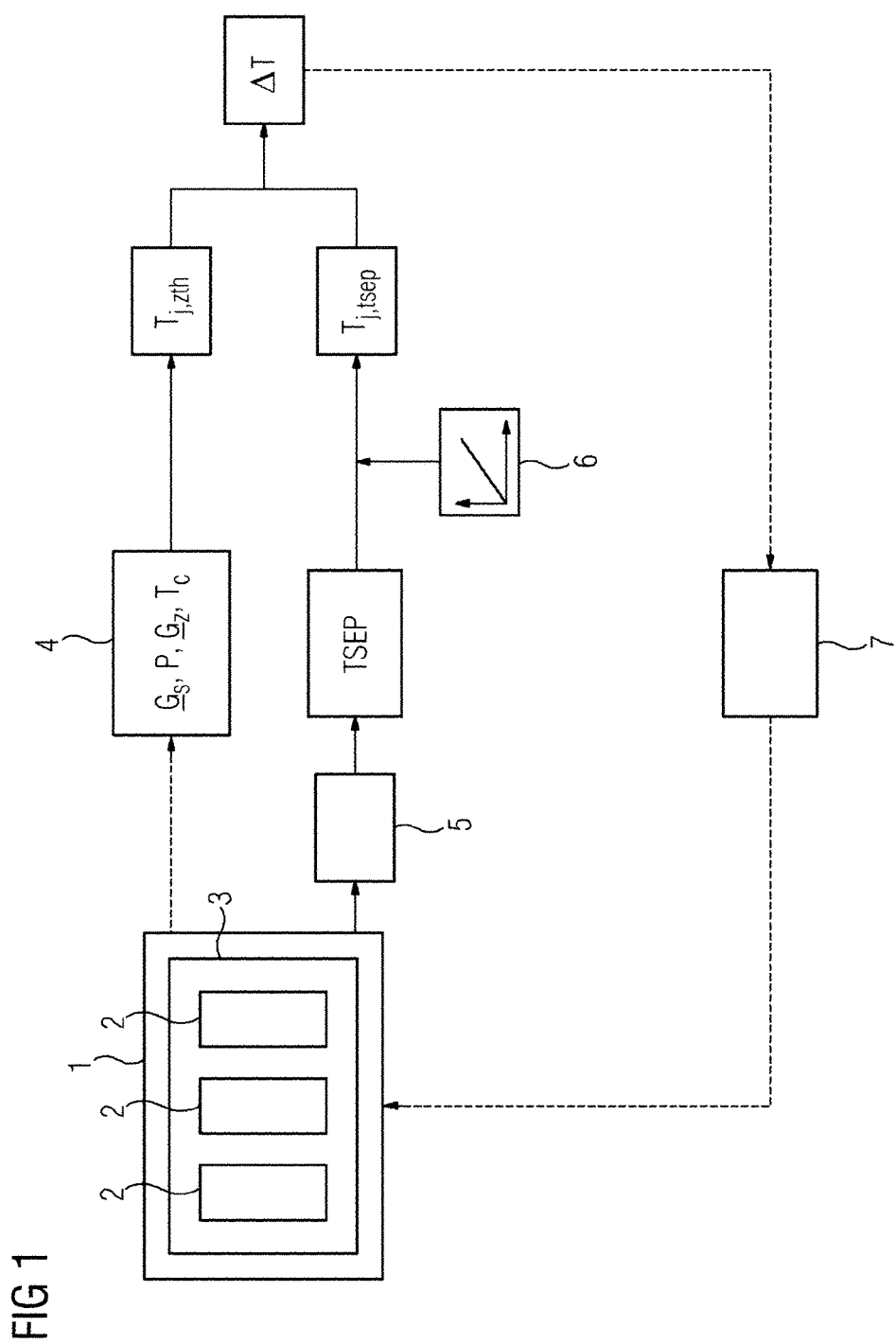
FIG. 1 shows a schematic diagram of a power semiconductor module, according to teachings of the present disclosure.

The methods described herein may characterize a power semiconductor module with at least one power semiconductor component. In some embodiments, a thermal model of the power semiconductor module is determined at a reference time point. A reference temperature is established on the basis of the thermal model of the power semiconductor module. At least one Temperature-Sensitive Electrical Parameter (TSEP) of the power semiconductor module at at least one later point in time compared to the reference time point during operation of the power semiconductor module is measured. A current temperature of the power semiconductor module is established from the at least one measured temperature-sensitive electrical parameter of the power semiconductor module. A temperature difference between the current temperature and the reference temperature is established. Finally, a deterioration of the power semiconductor module is determined on the basis of the temperature difference established.

The power semiconductor module may comprise an inverter or a converter for example and may have an IGBT as the at least one power semiconductor component. To predict a remaining lifetime of the power semiconductor module, the deterioration or a deterioration progress of the power semiconductor module is determined. To do this the thermal model characterizing the power semiconductor module is determined for the power semiconductor module at the reference time point. The thermal model serves to describe the thermal behavior of the power semiconductor module. In particular, heat sources or heat sinks within the power semiconductor module are included in the thermal model. Such heat sources may be calculated via a power dissipation of the power semiconductor module, which can be determined on the basis of current and voltage measurements.

At the reference time point, at which the thermal model is determined, the power semiconductor module has a non-deteriorated state, which is also referred to as a healthy state of the power semiconductor module, in which the power semiconductor module does not exhibit any fatigue occurrences or wear occurrences. In some embodiments, this reference time point lies before a commissioning of the power semiconductor module. This means that the power semiconductor module was not yet subjected to any thermomechanical stresses, which usually lead to the fatigue or accelerated deterioration of the power semiconductor module. This thermal model created at the reference time point thus represents an initial state of the power semiconductor module.

On the basis of this thermal model, the reference temperature of the power semiconductor module corresponding to a so-called junction temperature is established. Through this reference temperature, the non-deteriorated state or the healthy state of the power semiconductor module is characterized. For example, in a thermal model which characterizes the power semiconductor module via the power dissipation, the reference temperature can be calculated directly from the known relationships between power dissipation and temperature.

After determination of the reference temperature at the later time point later in time after the reference time point, at least one temperature-sensitive electrical parameter of the power semiconductor module is measured during operation of the power semiconductor module, for example during inverter operation of the power semiconductor module having the inverter. During operation when the power semiconductor module is being used according to specification, the power semiconductor module is subjected to thermomechanical stresses, through which the power semiconductor module can deteriorate. The measurement can be made continually or at predetermined measurement time points during the operation of the power semiconductor module.

For measurement of the at least one temperature-sensitive electrical parameter of the power semiconductor module a corresponding measurement circuit can be provided. There can also be provision for the power semiconductor module or the at least one power semiconductor element to have an integrated measurement device, for example a diode, on the basis of which a temperature monitoring of the power semiconductor modules can be carried out.

A current temperature that the power semiconductor module has at the respective measurement time point is established or calculated from the at least one temperature-sensitive electrical parameter. This current temperature is compared with the reference temperature and the temperature difference between the reference temperature and the current temperature may be determined.

During the deterioration of the power semiconductor module, by occurrences of wear for example, e.g., through the loosening of bond or solder connections already described, a temperature of the power semiconductor module changes by comparison with the reference temperature of the power semiconductor module in the healthy state. The loosening of the solder connection may mean that heat produced by the power semiconductor component during operation can no longer be dissipated or can only be poorly dissipated via the solder connection. Through this the current temperature of power semiconductor module can increase during operation.

A deterioration of the power semiconductor module can be estimated or determined on the basis of the temperature difference. In a non-deteriorated state this temperature difference is approximately zero. As deterioration proceeds and wear occurrences increase the temperature difference continues to increase, wherein the relative change of the temperature difference delivers an indication of a deteriorating power semiconductor module.

Thus, by establishing the temperature difference, a deterioration of the power semiconductor module can be determined and thereby a remaining lifetime or an availability of the semiconductor module can be predicted. This enables reliable operation of the power semiconductor module in its respective area of application. The fact that the deterioration is determined during operation or during the operating phases of the power semiconductor module enables operation without interruption of the power semiconductor module.

In addition, establishing the deterioration enables a temperature-difference-dependent power regulation of the power semiconductor module for avoiding increased operating temperatures and temperature change stresses. For example, a control device may, on the basis of the temperature difference established, carry out a corresponding power regulation for an efficient operation of the power semiconductor module. Thus the efficient operation of the power semiconductor module enables a progressive deterioration and thus a premature failure of the power semiconductor module to be counteracted.

In some embodiments, for creating the thermal model, a thermal impedance of the power semiconductor module describing a thermal path of the power semiconductor module is determined. The thermal impedance of the power semiconductor module is established or measured at the reference time point, at which the power semiconductor module has the initial state, or the non-deteriorated state respectively. By means of the thermal impedance the thermal path of the power semiconductor module can be described or parameterized respectively. The thermal impedance is a characteristic heat value and a measure for a temperature difference, which arises in the power semiconductor module when a flow of heat is passing through it. With power semiconductor modules that have an interconnection of a number of power semiconductor components, the thermal impedance of the power semiconductor module is composed of individual thermal impedances of the power semiconductor components.

The thermal impedance can be calculated for example from an equivalent thermal network. To do this, the characteristic variables describing the thermal behavior can be transformed into electrical variables. With these electrical variables an electrical network can be created, which can be calculated analytically or by means of a circuit simulator. Establishing the thermal impedance enables an especially precise and reliable model of the power semiconductor module to be determined.

In some embodiments, a power dissipation or a heat power of the power semiconductor module is determined for creation of the thermal model. The heat power or the power dissipation is calculated at the operating point of the power semiconductor module by measuring the output voltage and the output current of the power semiconductor module and by forming the product of output voltage and output current. On the basis of the determination of the heat power of the power semiconductor module the thermal model can be created in an especially simple way.

In some embodiments, to create the thermal model, a temperature of a cooling element of the power semiconductor module during operation of the power semiconductor module is acquired. Such a cooling element can be a cooling plate for example, of which the temperature is measured during operation of the power semiconductor module. The cooling element as a heat source or a heat sink can thus likewise be taken into account in the thermal model, through which the thermal model is designed especially accurately and reliably.

In some embodiments, at least one of the following variables is measured as the at least one temperature-sensitive electrical parameter of the power semiconductor module, which may include an IGBT as the at least one power semiconductor component: An electrical threshold voltage, a gate-emitter voltage, a Miller plateau, a turn-on delay time of the power semiconductor module, a turn-off delay time of the power semiconductor module, a speed of current increase, a recovered charge or a recovery charge, a tail current, which characterizes the turn-off losses of the power semiconductor module, a voltage peak of the power semiconductor module during a turn-on process, a turn-on duration of the power semiconductor module, and/or a turn-off duration of the power semiconductor module. Since each of these variables is temperature-dependent, a current temperature of the power semiconductor module can be determined from these measured values of these variables in an especially simple manner.

In some embodiments, a characteristic curve for the power semiconductor module may be determined, on the basis of which each value of the at least one temperature-sensitive electrical parameter is assigned a temperature value in each case, wherein one of the temperature values is determined as a function of the measured temperature-sensitive electrical parameter as the current temperature. This characteristic curve may be determined once at a calibration point, for example in the healthy state of the power semiconductor module.

Plotted in this characteristic curve against the temperature are values of the at least one temperature-sensitive electrical parameter. At the later time point, based on the predetermined characteristic curve, the temperature corresponding to the value of the temperature-sensitive electrical parameter measured during operation can be determined especially quickly and without any great calculation effort as the current temperature. With a continual measurement of the temperature-sensitive electrical parameter during operation of the power semiconductor module there can thus in particular be a real-time measurement of the temperature difference and thus an online lifetime monitoring. This enables the progress of a deterioration of the power semiconductor module to be detected at an early stage.

In some embodiments, the characteristic curve is determined by the temperature values for the power semiconductor module being predetermined, by the power semiconductor module being set to the respective temperature value and by the respective value of the at least one temperature-sensitive electrical parameter being measured at the predetermined temperature value. In other words this means that the temperature of the power semiconductor module is actively set to the predetermined temperature values. For setting the temperature, some embodiments include a heating device by means of which the power semiconductor module can be heated up to the respective predetermined temperature values.

In some embodiments, to determine the values of the at least one temperature-sensitive electrical parameter at the various predetermined temperature values, the temperature of the power semiconductor module can be increased in stages by means of the heating device. As soon as the power semiconductor module, at the temperature provided by the heating device, is in a thermally synchronized state with the predetermined temperature value, the respective value of the at least one temperature-sensitive electrical parameter is measured. Thus, each temperature value can be uniquely assigned a value of the respective temperature-sensitive electrical parameter. This calibration of the temperature-sensitive electrical parameter enables the current temperature of the power semiconductor module during operation to be determined especially quickly and easily or to be read out from the characteristic curve at the later point in time.

In some embodiments, the at least one temperature-sensitive electrical parameter for determining the characteristic curve as a function of the predetermined temperature is measured by means of a double-pulse measurement circuit. Such a double-pulse measurement circuit is known for example from "Halbleiter-Leistungsbauelemente" [semiconductor components] (Josef Lutz, Springer-Verlag Berlin Heidelberg 2006, P. 126/127). In this circuit, in the thermally synchronized state of the power semiconductor module, two voltage pulses are created at the gate-emitter connection of the IGBT or IGBTs, the turn-on and turn-off processes of the IGBT or IGBTs are detected and subsequently the temperature-sensitive electrical Parameter (TSEP) is evaluated as a function of the predetermined temperature.

In some embodiments, there is a device for characterizing a power semiconductor module during operation of the power semiconductor module with a measurement device for measuring at least one temperature-sensitive electrical parameter of the power semiconductor module and a calculation device for establishing a current temperature from the at least one temperature-sensitive electrical parameter and for calculating a temperature difference between a predetermined reference temperature and the current temperature. The device is used for online monitoring of the temperature difference, i.e. for a continual monitoring of the temperature difference, and thus for a continual monitoring of the remaining lifetime during operation of the power semiconductor module.

In some embodiments, there is a circuit arrangement having a power semiconductor module with at least one power semiconductor component and an inventive device for determining the deterioration of the power semiconductor module also belong to the invention.

In some embodiments, the power semiconductor module comprises an inverter and at least one cooling element, wherein the inverter as the at least one power semiconductor component has at least one IGBT.

In some embodiments, the circuit arrangement comprises a control device that is designed to regulate a power of the power semiconductor module on the basis of the temperature difference established.

FIG. 1 shows a schematic of a power semiconductor module 1, which here has a number of power semiconductor components 2. The power semiconductor module 1 includes a cooling element 3, on which the power semiconductor components 2 are arranged and which serves to cool the power semiconductor components 2 during operation of the power semiconductor module 1. As shown in this embodiment, the geometrical dimensions of the cooling element 3 are greater than the power semiconductor components 2 connected together. The power semiconductor module 1 may include a converter and/or an inverter. In some embodiments, the power semiconductor components 2 may include IGBTs for example.

During the operation of the power semiconductor module 1, the module is subject to thermal stresses for example, through which the power semiconductor module 1 deteriorates. This deterioration can lead to a reduction of a lifetime or of a functional integrity of the power semiconductor module 1 and to a premature failure of the power semiconductor module 1. The methods described below may be employed to determine the deterioration of the power semiconductor module 1 during operation of the power semiconductor module 1 and thus to predict a remaining lifetime or availability of the power semiconductor module 1.

At a reference time point, at which the power semiconductor module 1 has a healthy, non-deteriorated state, a thermal model 4 of the power semiconductor module 1 is determined. The thermal model 4 here comprises matrixes $\overline{G}_S$ and $\overline{G}_Z$, which contain transformation functions. These transformation functions describe a thermal path of the power semiconductor module 1 and can be calculated from the measured thermal impedances of the power semiconductor components 2. In addition, the thermal model 4 here also includes heat sources or heat sinks within the power semiconductor module 1, which are specified or characterized here via a power dissipation P or heat power as well as via a cooling element temperature $T_C$ of the cooling element 3. The thermal path can also comprise a housing temperature as well as a heat conducting paste. The power dissipation P can be calculated at the operating point of the power semiconductor module 1 from an output voltage measured at the reference time point measured and from an output current measured at the reference time point. The cooling element temperature $T_C$ is measured during operation of the power semiconductor module 1. A reference temperature $T_{j,zth}$ is determined from the thermal model 4. In some embodiments, the reference temperature $T_{j,zth}$ can be determined on the basis of the following equation:

$$T_{j,zth} = \overline{G}_S * P + \overline{G}_Z * T_C,$$

where * is a convolution operator.

At a later point in time, which lies at a time after the reference time point, at least one temperature-sensitive electrical parameter TSEP can be determined during operation of the power semiconductor module 1, for example by means of a measurement circuit 5. Such a temperature-sensitive electrical parameter TSEP can be a threshold voltage (gate-emitter voltage), Miller plateau, a turn-on delay time, a turn-off delay time, a speed of current increase, a recovered charge, a tail current, a voltage peak between emitter and auxiliary emitter during a turn-on process, and/or also a turn-on and turn-off duration of the power semiconductor module 1.

In some embodiments, on the basis of the temperature-sensitive electrical parameter TSEP determined, a current temperature $T_{j,tsep}$ of the power semiconductor module 1 is determined. The current temperature $T_{j,tsep}$ can be determined for example by means of a predetermined characteristic curve 6. Plotted in the characteristic curve 6 against the temperature are values for a temperature-sensitive electrical parameter. The characteristic curve 6 can have been determined for example at a calibration time point e.g., before the commissioning of the power semiconductor module 1. To do this the power semiconductor module 1 has been set to predetermined temperature values, the corresponding temperature-sensitive electrical parameter measured at the predetermined, set temperature value and the respective value pairs shown in the characteristic curve 6.

In some embodiments, when the at least one temperature-sensitive electrical parameter TSEP is acquired during operation, by means of the measurement circuit 5 for example, the current temperature $T_{j,tsep}$ of the power semiconductor module 1 can be established by means of the predetermined characteristic curve 6. The at least one temperature-sensitive electrical parameter TSEP can be acquired for example continually or at predetermined measurement time points during the operation of the power semiconductor module 1.

In some embodiments, a temperature difference $\Delta T$ is formed from the current temperature $T_{j,tsep}$ and the reference temperature $T_{j,zth}$, wherein $\Delta T = |T_{j,tsep} - T_{j,tsep}|$. On the basis of the temperature difference $\Delta T$, a deterioration of the power semiconductor module 1 can be determined, since the current temperature $T_{j,tsep}$, changes for example as a result of occurrences of wear on the power semiconductor module 1. In a non-deteriorated state the temperature difference $\Delta T$ is zero, i.e. $\Delta T=0$.

As deterioration progresses the temperature difference $\Delta T$ increases. The relative change of the temperature thus gives information about a deteriorating power semiconductor module 1. With a continuing acquisition of the temperature-sensitive electrical parameter TSEP and a continuing determination of the temperature difference $\Delta T$, a deterioration of the power semiconductor module 1 can be continually monitored and a possible impending failure of the power semiconductor module 1 can be recognized at an early stage.

In some embodiments, to prolong the remaining lifetime the temperature difference $\Delta T$ can be provided to a control device 7 designed to regulate a power of the power semiconductor module 1 as a function of the temperature difference $\Delta T$. This enables higher operating temperatures and temperature change stresses and thus an ongoing deterioration of the power semiconductor module 1 to be avoided.

Figure 2:
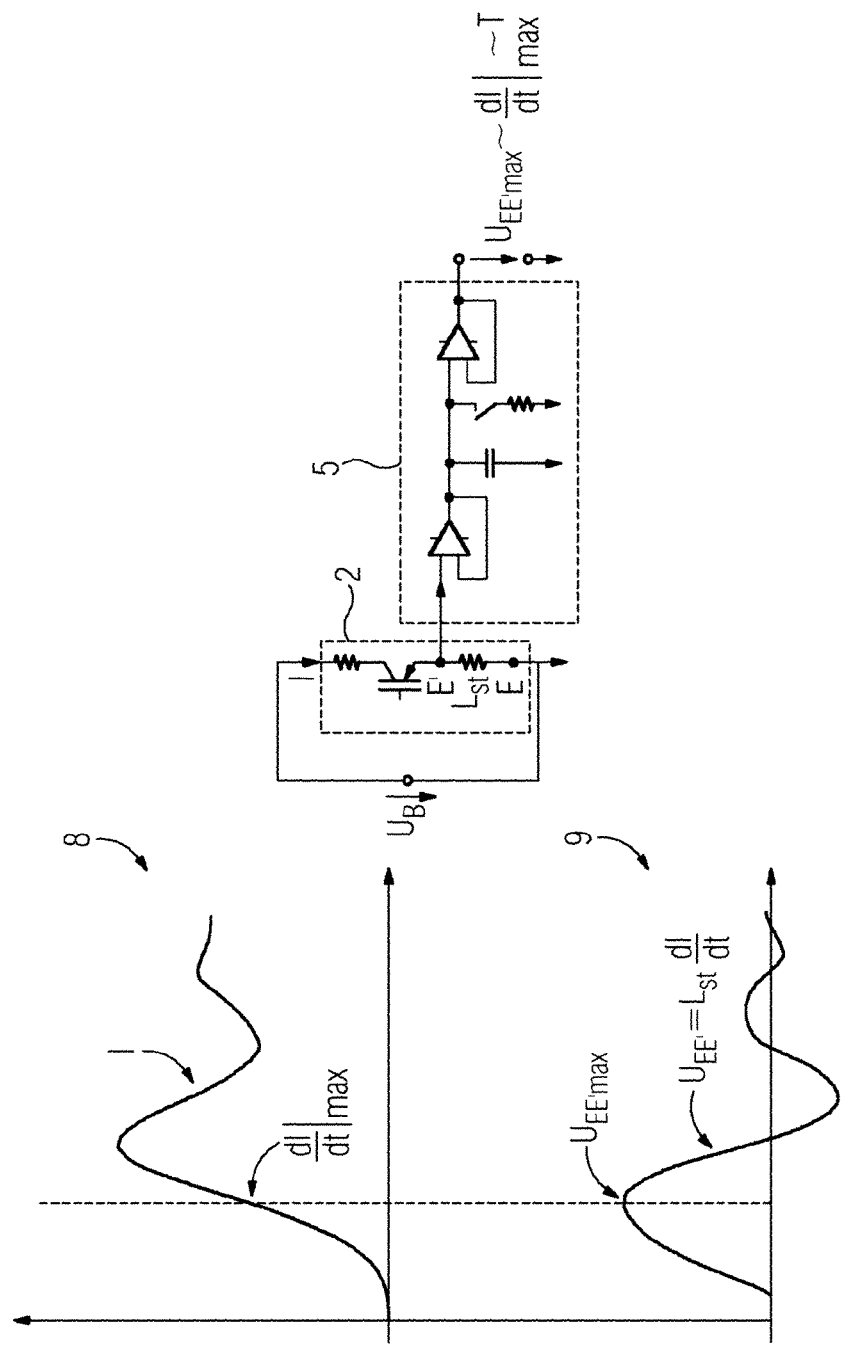
FIG. 2 shows a schematic diagram of a measurement circuit for measurement of temperature-sensitive electrical parameters of a power semiconductor component and also associated characteristic curves of the power semiconductor component, according to teachings of the present disclosure.

FIG. 2 shows an example of a measurement circuit 5 for measurement of temperature-sensitive electrical parameters TSEP of a power semiconductor component 2 as well as two characteristic curves 8 and 9. Shown in the upper characteristic curve 8 is a current curve I during a turn-on process of the power semiconductor component 2. Shown in the lower characteristic curve 9 is a voltage drop $U_{EE'}$ at a stray inductance $L_{st}$ between an emitter connection E of the power semiconductor component 2 and a so-called auxiliary emitter E' of the power semiconductor component 2. By means of the measurement circuit 5 a maximum speed of current increase $dI/dt|_{max}$ and from this a voltage peak $U_{EE'max}$ during a turn-on process of the power semiconductor component 2 is determined here as the temperature-sensitive electrical parameter TSEP.

Figure 3:
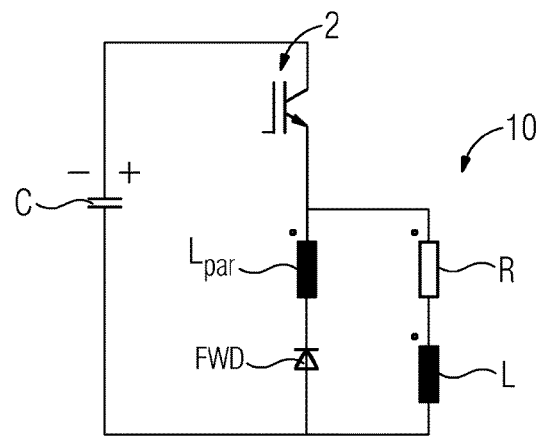
FIG. 3 shows a schematic diagram of a double-pulse measurement circuit for carrying out a double-pulse trial with associated characteristic input and output curves according to teachings of the present disclosure.
Figure 3:
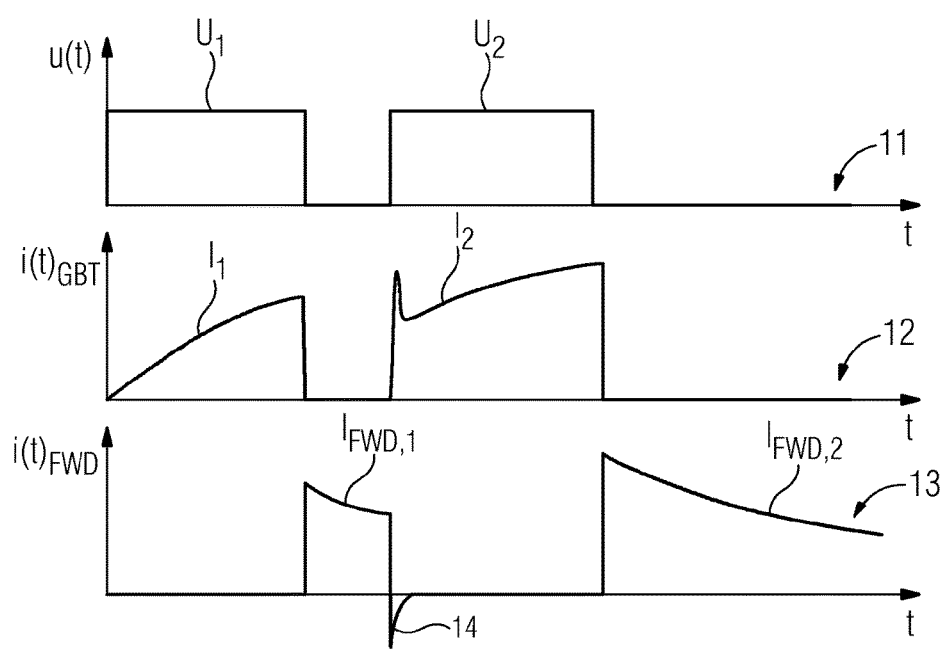

FIG. 3 shows a double-pulse measurement circuit 10 for carrying out a double-pulse trial with an input characteristic curve 11 and two output characteristic curves 12 and 13. This measurement circuit 10 as well as the characteristic curves 11, 12 and 13 are known from "Halbleiter-Leistungsbauelemente" [semiconductor power components] (Josef Lutz, Springer-Verlag Berlin Heidelberg 2006, P. 126/127). The double-pulse trial can be used for example for measuring temperature-sensitive electrical parameters TSEP, for example a peak reverse recovery current 14, at a predetermined temperature for creating the characteristic curve 6. The double-pulse measurement circuit 10 comprises the power semiconductor component 2 embodied as an IGBT, a capacitor C, a resistor R, and a coil L, which form an ohmic-inductive load, a free-wheeling diode FWD, as well as a parasitic inductance $L_{par}$, which is formed as a result of the lines between the capacitor C, the power semiconductor component 2 and the diode FWD.

In some embodiments, for measurement a first voltage pulse $U_1$ is created at the input of the power semiconductor component 2, which is shown plotted over time t in characteristic curve 11. The current curve $I_1$ of the power semiconductor component 2 during the first voltage pulse $U_1$ is shown plotted over time t in characteristic curve 12. After the power semiconductor component 2 has been turned off, i.e. after the first voltage pulse $U_1$, the current $I_{FWD,1}$ will be accepted by the free-wheeling diode FWD, the current curve of which is shown plotted over time t in characteristic curve 13. With the next turning-on of the power semiconductor component 2, i.e. with the second voltage pulse $U_2$ at the input of the power semiconductor component 2, the diode FWD is commuted and the power semiconductor component 2 accepts at turn-on the additional peak reverse recovery current 14 of the diode FWD, which is acquired as the temperature-sensitive electrical parameter TSEP at the predetermined temperature.

What is claimed is:

1. A method for characterizing a power semiconductor module with a power semiconductor component, the method comprising:
   developing a thermal model of the power semiconductor module at a reference time point;
   establishing a reference temperature based at least in part on the thermal model of the power semiconductor module;
   measuring a temperature-sensitive electrical parameter of the power semiconductor module at a later point in time during operation of the power semiconductor module;

determining a current temperature of the power semiconductor module from the measured temperature-sensitive electrical parameter of the power semiconductor module;

calculating a temperature difference between the current temperature and the reference temperature; and determining a deterioration of the power semiconductor module based at least in part on the calculated temperature difference.

2. The method as claimed in claim 1, wherein the thermal model depends on a thermal impedance of the power semiconductor module describing a thermal path of the power semiconductor module.

3. The method as claimed in claim 1, wherein the thermal model depends on a power dissipation of the power semiconductor module.

4. The method as claimed in claim 1, wherein the thermal model depends on a temperature of a cooling element of the power semiconductor module acquired during operation of the power semiconductor module.

5. The method as claimed in claim 1, wherein the power semiconductor module comprises an IGBT.

6. The method as claimed in claim 5, wherein the temperature-sensitive electrical parameter comprises a parameter selected from the group consisting of an electrical threshold voltage, a Miller plateau, a turn-on delay time, a turn-off delay time, a maximum speed of current increase, a recovered charge, a tail current, a voltage peak during a turn-on process, a turn on duration, and a turn-off duration.

7. The method as claimed in claim 1, further comprising creating a characteristic curve assigning each value of the temperature-sensitive electrical parameter to a corresponding temperature value;

wherein one of the temperature values is determined as a function of the measured temperature-sensitive electrical parameter as the current temperature.

8. The method as claimed in claim 7, wherein the temperature values are predetermined for the power semiconductor module; and further comprising setting the power semiconductor module a predetermined temperature value and the respective value of the temperature-sensitive electrical parameter is measured at the predetermined temperature value.

9. The method as claimed in claim 8, wherein a heating device set the temperature values by increasing a temperature of the power semiconductor module step-by-step to the respective predetermined temperature values.

10. The method as claimed in claim 8, further comprising measuring the temperature-sensitive electrical parameter for creating the characteristic curve at the respective predetermined temperature value with a double-pulse measurement circuit.

11. The method as claimed in claim 1, further comprising regulating a power of the power semiconductor module as a function of the calculated temperature difference.

12. A device for characterizing a power semiconductor module during operation of the power semiconductor module, the device comprising:

a meter for measuring a temperature-sensitive electrical parameter of the power semiconductor module; and a processor for determining a current temperature from the measured temperature-sensitive electrical parameter and calculating a temperature difference between a predetermined reference temperature and the determined current temperature.

13. A circuit arrangement comprising:

a power semiconductor module with a power semiconductor component;

a meter for measuring a temperature-sensitive electrical parameter of the power semiconductor module; and a processor for determining a current temperature from the measured temperature-sensitive electrical parameter and calculating a temperature difference between a predetermined reference temperature and the determined current temperature.

14. The circuit arrangement as claimed in claim 13, wherein the power semiconductor module comprises an inverter and a cooling element; and wherein the inverter includes an IGBT.

15. The circuit arrangement as claimed in claim 13, further comprising a control device to regulate a power of the power semiconductor module as a function of the calculated temperature difference.

* * * * *